(12) United States Patent
Chen et al.

(10) Patent No.: US 11,424,190 B2
(45) Date of Patent: Aug. 23, 2022

(54) MULTI-CHIP PACKAGE AND MANUFACTURE METHOD THEREOF

(71) Applicant: Industrial Technology Research Institute, Hsinchu (TW)

(72) Inventors: Chao-Jung Chen, Hsinchu County (TW); Yu-Min Lin, Hsinchu County (TW); Sheng-Tsai Wu, Taoyuan (TW); Shin-Yi Huang, Hsinchu County (TW); Ang-Ying Lin, Tainan (TW); Tzu-Hsuan Ni, Hsinchu (TW); Yuan-Yin Lo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 17/005,310

(22) Filed: Aug. 27, 2020

(65) Prior Publication Data

US 2021/0111125 A1    Apr. 15, 2021

(30) Foreign Application Priority Data

Apr. 29, 2020   (TW) .................................. 109114287

(51) Int. Cl.
*H01L 23/538* (2006.01)
*H01L 23/31* (2006.01)
(Continued)

(52) U.S. Cl.
CPC ...... *H01L 23/5386* (2013.01); *H01L 21/4853* (2013.01); *H01L 21/4857* (2013.01);
(Continued)

(58) Field of Classification Search
CPC ............. H01L 25/0655; H01L 23/5286; H01L 23/5283; H01L 21/565; H01L 23/3128;
(Continued)

(56) References Cited

U.S. PATENT DOCUMENTS 10,269,767 B2   4/2019   Chen et al.
10,276,526 B2   4/2019   Hsu et al.
(Continued)

FOREIGN PATENT DOCUMENTS

CN   106486383   3/2017
CN   109037170   12/2018
(Continued)

OTHER PUBLICATIONS

"Office Action of Taiwan Counterpart Application", dated Sep. 8, 2020, p. 1-p. 8.

*Primary Examiner* — Jasmine J Clark
(74) *Attorney, Agent, or Firm* — JCIPRNET

(57) ABSTRACT

A multi-chip package and a manufacturing method thereof are provided. The multi-chip package includes: an interposer including a dielectric body, a plurality of semiconductor bodies separated by the dielectric body, a through via penetrating through the dielectric body, and a wiring structure located in each of the plurality of semiconductor bodies; a plurality of semiconductor chips located side by side on a first surface of the interposer and electrically connected to the wiring structure; an encapsulant located on the first surface of the interposer and encapsulating at least a portion of the plurality of semiconductor chips; and a redistribution circuit structure located on a second surface of the interposer opposite to the first surface of the interposer and electrically connected to the plurality of semiconductor chips through the through via.

20 Claims, 14 Drawing Sheets

(51) Int. Cl.
  *H01L 23/00* (2006.01)
  *H01L 25/00* (2006.01)
  *H01L 21/48* (2006.01)
  *H01L 21/56* (2006.01)
  *H01L 25/065* (2006.01)
(52) U.S. Cl.
  CPC ........ *H01L 21/565* (2013.01); *H01L 23/3128* (2013.01); *H01L 23/5383* (2013.01); *H01L 24/08* (2013.01); *H01L 24/16* (2013.01); *H01L 25/0655* (2013.01); *H01L 25/50* (2013.01); *H01L 2224/08225* (2013.01); *H01L 2224/16227* (2013.01)
(58) Field of Classification Search
  CPC ..... H01L 23/49838; H01L 2224/16227; H01L 25/50; H01L 23/49816
  See application file for complete search history.

(56) References Cited

U.S. PATENT DOCUMENTS

| | | | |
|---|---|---|---|
| 2006/0226527 A1* | 10/2006 | Hatano | H01L 23/5389 438/109 |
| 2015/0357318 A1 | 12/2015 | Chen et al. | |
| 2017/0103943 A1* | 4/2017 | Hu | H01L 23/5383 |
| 2020/0365554 A1* | 11/2020 | Zhang | H01L 25/50 |

FOREIGN PATENT DOCUMENTS

| | | |
|---|---|---|
| TW | 201431028 | 8/2014 |
| TW | 201814843 | 4/2018 |
| TW | I636537 | 9/2018 |
| TW | 201926588 | 7/2019 |

* cited by examiner

MULTI-CHIP PACKAGE AND MANUFACTURE METHOD THEREOF

CROSS-REFERENCE TO RELATED APPLICATION

This application claims the priority benefit of Taiwan application no. 109114287, filed on Apr. 29, 2020. The entirety of the above-mentioned patent application is hereby incorporated by reference herein and made a part of this specification.

TECHNICAL FIELD

The disclosure relates to a multi-chip package and a manufacturing method thereof.

BACKGROUND

In order to provide the semiconductor package with both light and thin volume and high performance, the current packaging technology has tried to integrate multiple semiconductor chips into a single semiconductor package to form a multi-chip package or to stack multiple semiconductor packages in a 3-dimensional stacking technique to form Package on package (PoP) or System in Package. However, since the signal communication speed between multiple semiconductor chips in the existing multi-chip package is limited, overall performance of the semiconductor package still needs to be further improved.

SUMMARY

The disclosure provides a multi-chip package including an interposer, a plurality of semiconductor chips, an encapsulant and a redistribution circuit structure. The interposer includes a dielectric body, a plurality of semiconductor bodies separated by the dielectric body, a through via penetrating through the dielectric body, and a wiring structure located in each of the plurality of semiconductor bodies. The plurality of semiconductor chips are located side by side on a first surface of the interposer and electrically connected to the wiring structure. The encapsulant is located on the first surface of the interposer and encapsulates at least a portion of the plurality of semiconductor chips. The redistribution circuit structure is located on a second surface of the interposer and electrically connected to the through via, and the second surface of the interposer is opposite to the first surface of the interposer.

The disclosure provides a multi-chip package including an interposer, a plurality of semiconductor chips and a redistribution circuit structure. The interposer includes a dielectric body, a semiconductor body, a through via penetrating through the dielectric body and a wiring structure located in the semiconductor body, and the through via and the wiring structure are spaced apart from each other. The plurality of semiconductor chips are located side by side on a first surface of the interposer, and each of the plurality of semiconductor chips is simultaneously and electrically connected to the wiring structure and the through via. The redistribution circuit structure is located on a second surface of the interposer and electrically connected to the through via, and the second surface of the interposer is opposite to the first surface of the interposer.

The disclosure provides a manufacturing method of multi-chip package which includes the following steps. A plurality of semiconductor chips are provided on a first surface of a semiconductor substrate so that each of the plurality of semiconductor chips is electrically connected to a wiring structure in the semiconductor substrate. An encapsulant is formed on the first surface of the semiconductor substrate to encapsulate the plurality of semiconductor chips. At least a portion of the semiconductor substrate is removed from a second surface of the semiconductor substrate opposite to the first surface so that remaining portions of the semiconductor substrate are separated from each other. A dielectric body is formed in a space generated after the semiconductor substrate is removed. In the dielectric body, a through via penetrating through the dielectric body and connected to the plurality of semiconductor chips is formed. A redistribution circuit structure is formed on the remaining portions of the semiconductor substrate and the dielectric body, and the redistribution circuit structure is electrically connected to the through via.

To make the aforementioned more comprehensible, several embodiments accompanied with drawings are described in detail as follows.

DETAILED DESCRIPTION

Figure 1:
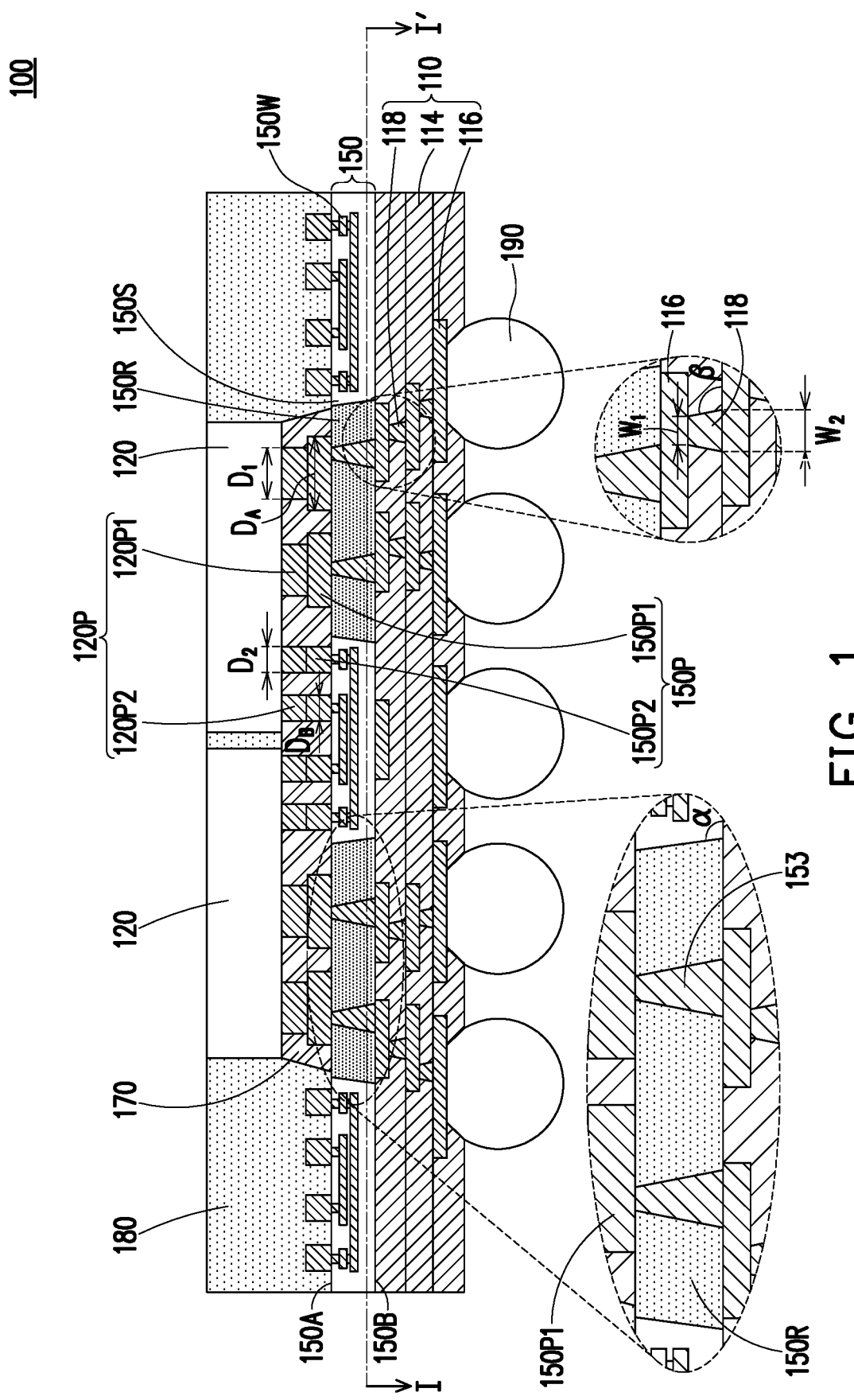
FIG. 1 is a cross-sectional view illustrating a multi-chip package according to an embodiment of the disclosure.

Some embodiments are provided hereinafter and described in detail with reference to the accompanied drawings. However, the embodiments provided are not intended to limit the scope of the disclosure. In addition, the drawings are for illustration purposes only and are not drawn according to the original size, and different layers or regions may be enlarged or reduced to be displayed in a single drawing. Moreover, although "first", "second", or the like are used herein to describe different elements, regions, and/or members, these elements, regions, and/or members should not be limited by these terms. Rather, these terms are only used to distinguish one element, region or component from another element, region or component. Therefore, a first element, region or member discussed below may be referred to as a second element, region or member without departing from the teachings of the embodiments. The same reference numbers are used in the drawings and the description to indicate the same or like parts, which are not repeated in the following embodiments.

Herein, spatially relative terms such as "upper" and "lower" are defined with reference to the accompanying drawings. Thus, it will be understood that the term "upper surface" could be used interchangeably with the term "lower surface", and when an element such as a layer or a film is referred to as being disposed on another element, it could be directly placed on the other element, or intervening element(s) may be present between the tow elements. On the other hand, when an element is referred to as being disposed directly on another element, there are no intervening element(s) between the two elements. Similarly, when an element is referred to as being connected or bonded to another element, the element may be directly connected or directly bonded to another element, or intervening element(s) may be present between the tow elements On the other hand, when an element is referred to as being directly connected or directly bonded to another element, there are no intervening element(s) between the two elements.

Figure 2:
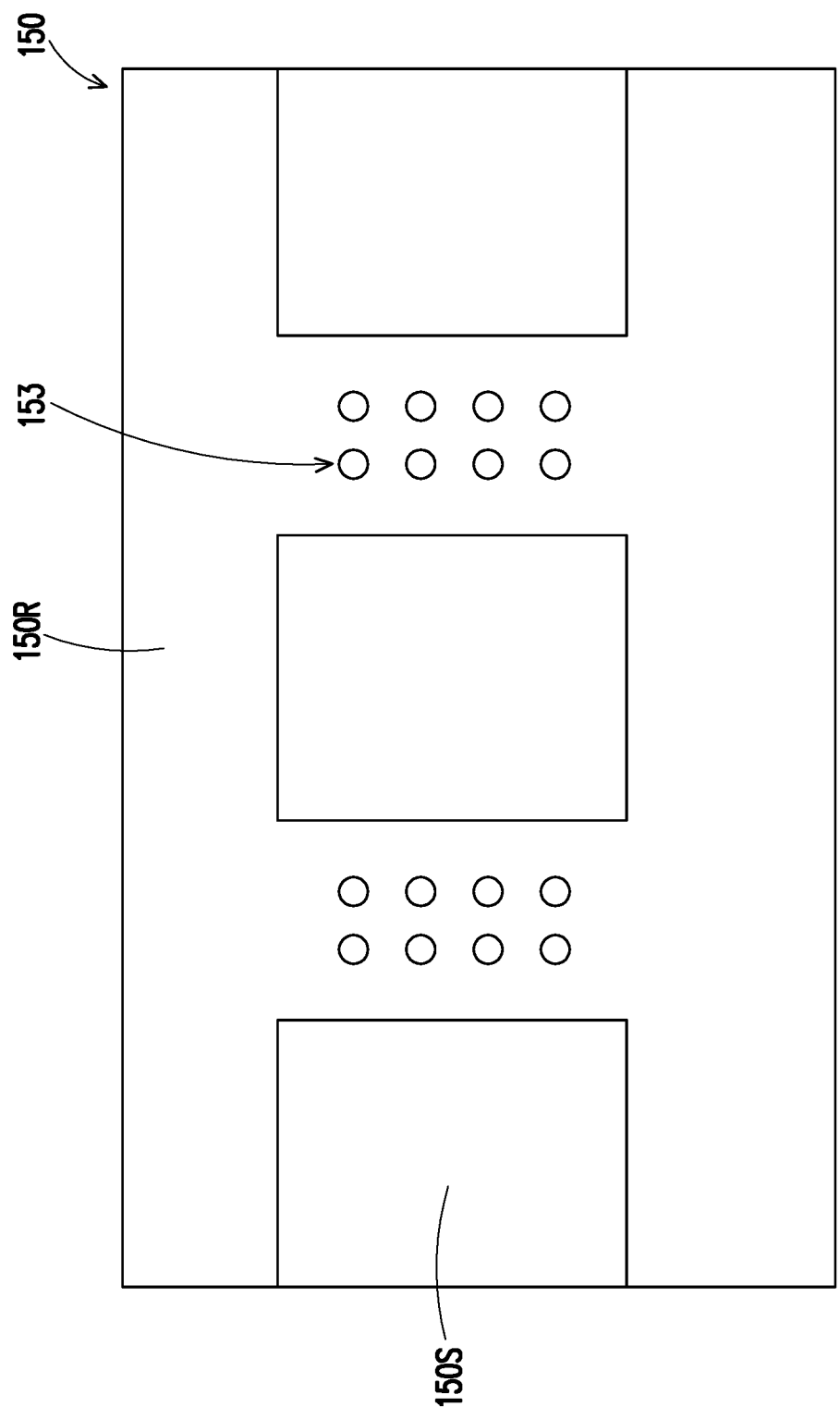
FIG. 2 is a plane view of the multi-chip package of FIG. 1 taken along a section line I-I'.

FIG. 1 is a cross-sectional view illustrating a multi-chip package according an embodiment of the disclosure. FIG. 2 is a plane view of the multi-chip package of FIG. 1 taken along a section line I-I'.

Referring to FIG. 1, a multi-chip package 100 according to an embodiment of the disclosure includes an interposer 150, semiconductor chips 120 on a first surface 150A of the interposer 150 and a redistribution circuit structure 110 on a second surface 150B of the interposer 150 opposite to the first surface 150A. Referring to FIG. 2, a body of the interposer 150 may be composed of a dielectric body 150R and a plurality of semiconductor bodies 150S separated by the dielectric body 150R. A through via 153 penetrating through the dielectric body 150R is formed in the dielectric body 150R. A wiring structure 150W is formed in the semiconductor body 150S. The wiring structure 150W may be used to transmit signals between the semiconductor chips 120 arranged side by side, especially high frequency signals. The through via 153 may be used as a ground path or a power path between the semiconductor chip 120 and the redistribution circuit structure 110 for transmitting high current.

In the current System in Package, the redistribution circuit structure is used to transmit signals between the semiconductor chips arranged side by side. However, with the increase of high efficiency computing applications, the transmission demand for high frequency signals is also increasing. Due to the restriction of the line width, the line spacing and the exposure and development ability of an organic dielectric layer, the redistribution circuit structure does not have many layers used for connection. Therefore, a connection structure with a higher line density is still required to meet the bandwidth requirements of, for example, High Bandwidth Memory (HBM). In order to achieve faster signal transmission, the multi-chip package of the disclosure transmits signals between the semiconductor chips 120 by using the wiring structure 150W having the higher line density (i.e., a smaller line width and a greater number of layers) than the redistribution circuit structure.

For instance, the number of layers of the redistribution circuit structure is generally 3. With respect to the redistribution circuit structure, a line width size is generally about 2 μm; a line spacing size is generally about 2 μm; a via size is generally about 2 μm. With respect to the wiring structure 150W in the multi-chip package according to the disclosure, the number of layers may be 4 or more; a line width size may fall in a range from about 0.01 μm to 1 μm (e.g., about 0.2 μm, about 0.4 μm, about 0.6 μm or about 0.8 μm); a line spacing size may fall in a range from about 0.01 μm to 1 μm (e.g., about 0.2 μm, about 0.4 μm, about 0.6 μm or about 0.8 μm); a via size may fall in a range from about 0.01 μm to 1 μm (e.g., about 0.2 μm, about 0.4 μm, about 0.6 μm or about 0.8 μm). Because the multi-chip package of the disclosure uses the wiring structure 150W with a line width less than or equal to 1 μm to connect to the semiconductor chips 120, a high frequency signal transmission may be performed between the different semiconductor chips 120.

Furthermore, because the interposer 150 in the multi-chip package according to the disclosure is composed of the dielectric body 150R and the semiconductor bodies 150S and the through via 153 is formed in the dielectric body 150R, the interposer 150 of the multi-chip package according to the disclosure could omit through silicon vias, so as to reduce costs and improve yield rate.

Specifically, the body of the interposer 150 may be composed of the dielectric body 150R and the semiconductor bodies 150S separated by the dielectric body 150R. The semiconductor bodies 150S may be physically separated from each other. The material of the semiconductor body 150S may be semiconductor materials such as silicon (Si), germanium (Ge), and gallium arsenide (GaAs), for example. The material of the dielectric body 150R may include polyimide, epoxy resin, acrylic resin, phenolic resin, bismaleimide-trazine resin (BT resin) or any other suitable polymer dielectric materials and silicon oxide layer, silicon nitride layer, silicon oxynitride layer or other suitable silicon dielectric materials. In certain embodiments, the material of the dielectric body 150R may include photosensitive insulating resin. An interface between the dielectric body 150R and the semiconductor body 150S may not be perpendicular to a surface of the interposer 150. For instance, an included angle α between a sidewall of the semiconductor body 150S and the second surface 150B may be greater than 90°. In other words, a width of the semiconductor body 150S decreases as a distance from the semiconductor chips 120 increases, and a width of the dielectric body 150R increases as a distance from the semiconductor chips 120 increases. However, the disclosure is not limited in this regard. For instance, the interface between the dielectric body 150R and the semiconductor body 150S may also be perpendicular to the surface of the interposer 150. As used herein, "width" refers to a length of the described component in the horizontal direction in a schematic longitudinal cross-sectional view of the multi-chip package according to the disclosure (e.g., FIG. 1).

A wiring structure 150W is formed in the semiconductor body 150S. The wiring structure 150W may be used to transmit signals between the semiconductor chips 120, especially high frequency signals. The material of the wiring structure 150W may include, for example, conductive materials including copper (Cu), silver (Ag), palladium (Pd), aluminum (Al), nickel (Ni), titanium (Ti), gold (Au), platinum (Pt), tungsten (W) or alloys thereof or other metal with excellent electrical properties or alloys thereof. As described above, the wiring structure 150W has the high line density. In certain embodiments, with respect to the wiring structure 150W, the number of layers may be, 4 or more; a line width size may fall in a range from about 0.01 μm to 1 μm (e.g., about 0.2 μm, about 0.4 μm, about 0.6 μm or about 0.8 μm); a line spacing size may fall in a range from about 0.01 μm to 1 μm (e.g., about 0.2 μm, about 0.4 μm, about 0.6 μm or about 0.8 μm); a via size may fall in a range from about 0.01 μm to 1 μm (e.g., about 0.2 about 0.4 μm, about 0.6 μm or about 0.8 μm).

The dielectric body 150R is formed with the through via 153 penetrating through the first surface 150A and the second surface 150B. The material of the through via 153 may include conductive materials such as copper (Cu), silver (Ag), palladium (Pd), aluminum (Al), nickel (Ni), titanium (Ti), gold (Au), platinum (Pt), tungsten (W) or alloys thereof. The through via 153 may be used to connect the semiconductor chips 120 and the redistribution circuit structure 110 to each other. The through via 153 may have an upper width smaller than a lower width. In other words, a width of the through via 153 increases as a distance from the semiconductor chips 120 increases. Because the through via 153 is formed in the dielectric body 150R, the multi-chip package 100 of the disclosure may omit the process of forming through silicon vias, so as to reduce costs and improve yield rate.

An interposer connecting conductor 150P is formed on the first surface 150A of the interposer 150. The interposer connecting conductor 150P is connected to the wiring structure 150W of the interposer 150 and the through via 153. The interposer connecting conductor 150P may be used to connect the interposer 150 to other devices. The material of the interposer connecting conductor 150P may include, for example, conductive materials including copper (Cu), silver (Ag), palladium (Pd), aluminum (Al), nickel (Ni), titanium (Ti), gold (Au), platinum (Pt), tungsten (W) or alloys thereof or other metal with excellent electrical properties or alloys thereof. The shape of the interposer connecting conductor 150P may include various shapes such as pillar or stud bumps. The interposer connecting conductor 150P may have different sizes. For instance, the interposer connecting conductor 150P may include a first interposer connecting conductor 150P1 having a larger size and a second interposer connecting conductor 150P2 having a smaller size. That is to say, a width $D_A$ of the first interposer connecting conductor 150P1 is greater than a width $D_B$ of the second interposer connecting conductor 150P2. The larger first interposer connecting conductor 150P1 may be connected to the through via 153 of the interposer 150, and the smaller second interposer connecting conductor 150P2 may be connected to the wiring structure 150W. In other embodiments, the interposer connecting conductor 150P may have the same size.

The semiconductor chip 120 may be any suitable integrated circuit (IC) chip, such as a memory chip, a logic chip, a digital chip, an analog chip, a sensor chip, an artificial intelligence chip (AI chip), and a wireless and radio frequency chip or a voltage regulator chip. Among them, the sensor chip may be an image sensor chip, which at least includes a charge coupled device (CCD) or a complementary metal oxide semiconductor image sensor (CMOS image sensor). Although it is illustrated that two semiconductor chips 120 are included in the multi-chip package 100 of FIG. 1, the disclosure is not limited thereto. For instance, the multi-chip package of the disclosure may include three or more semiconductor chips.

The semiconductor chip 120 includes a chip connecting conductor 120P on an active surface. The material of the chip connecting conductor 120P may include, for example, conductive materials including copper (Cu), silver (Ag), palladium (Pd), aluminum (Al), nickel (Ni), titanium (Ti), gold (Au), platinum (Pt), tungsten (W) or alloys thereof or other metal with excellent electrical properties or alloys thereof. The shape of the chip connecting conductor 120P may include various shapes such as pillar or stud bumps. The chip connecting conductor 120P may have different sizes. For instance, the chip connecting conductor 120P includes a first chip connecting conductor 120P1 with a larger size and a second chip connecting conductor 120P2 with a smaller size. That is to say, a width $D_1$ of the first chip connecting conductor 120P1 is greater than a width $D_2$ of the second chip connecting conductor 120P2. The chip connecting conductor 120P and at least a portion of the interposer connecting conductor 150P are bonded to each other. In certain embodiments, the chip connecting conductor 120P and the interposer connecting conductor 150P correspondingly bonded to each other may have the corresponding size.

Figure 4A:
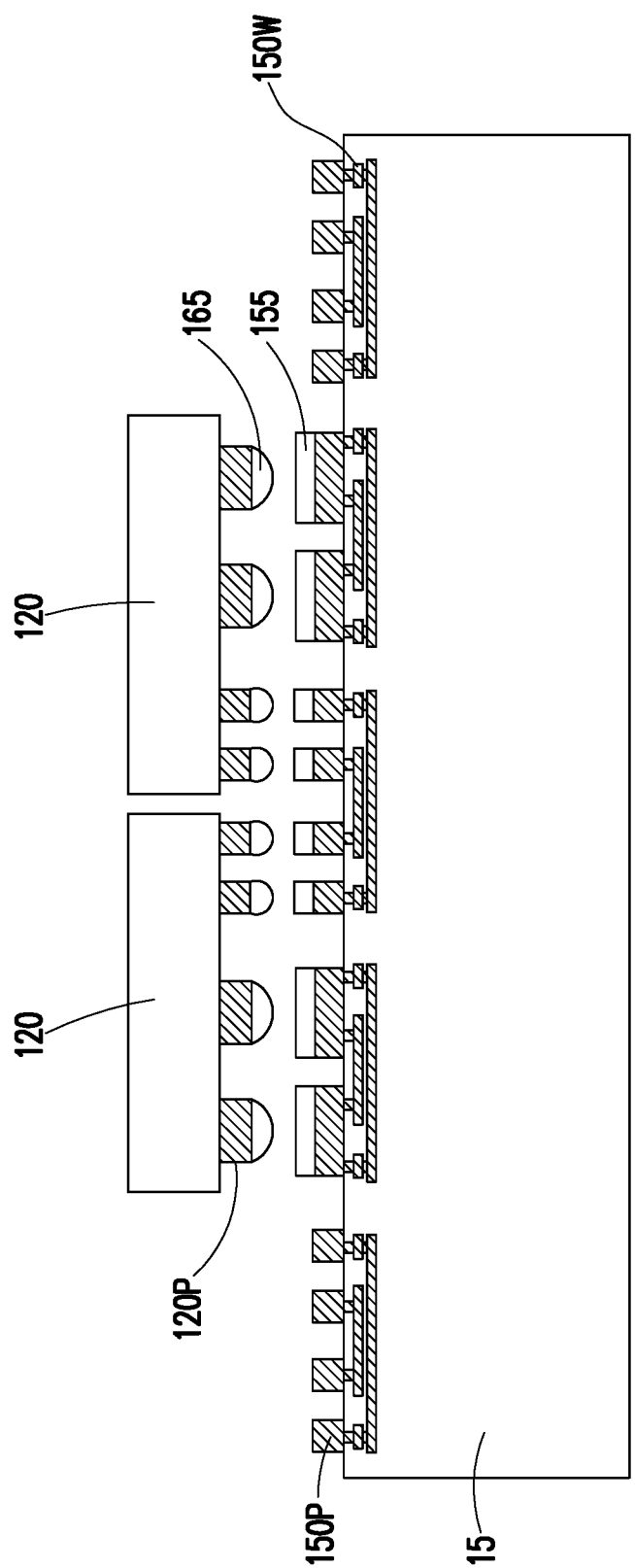
FIG. 4A and FIG. 4B are cross-sectional views illustrating a method of bonding chips according to an embodiment of the disclosure.
Figure 4B:
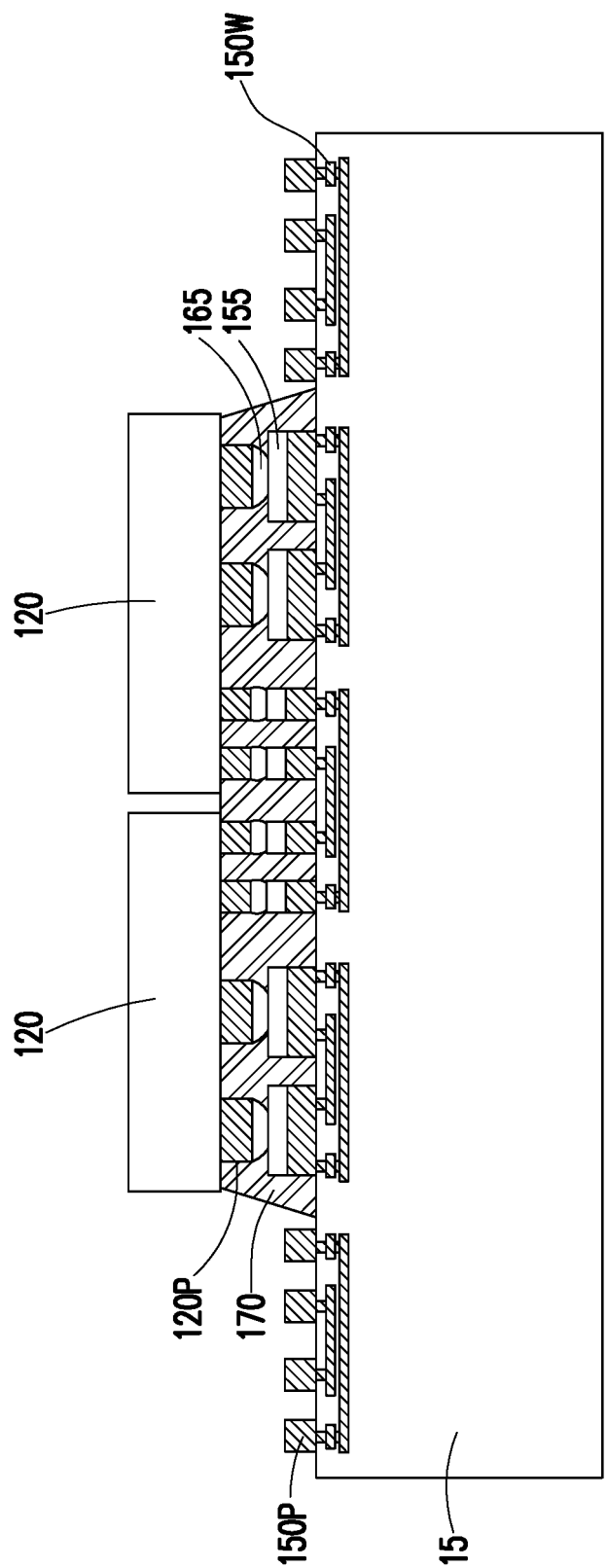

For example, the larger first chip connecting conductor 120P1 may be bonded to the larger first interposer connecting conductor 150P1, and the smaller second chip connecting conductor 120P2 may be bonded to the smaller second interposer connecting conductor 150P2. In this case, the larger first chip connecting conductor 120P1 and the first interposer connecting conductor 150P1 may be used to transmit high current (e.g., ground), while the smaller second chip connecting conductor 120P2 and the second interposer connecting conductor 150P2 may be used to transmit high frequency signals. A bonding surface between the chip connecting conductor 120P and the interposer connecting conductor 150P may be a solderless bonding surface. Because the interposer 150 and the semiconductor chips 120 are connected to each other through the chip connecting conductor 120P and the interposer connecting conductor 150P instead of the redistribution circuit structure, power and/or signal transmission paths between the interposer 150 and the semiconductor chip 120 may be shortened so that power and/or signal transmission speed and quality of may be improved. In certain embodiments, the chip connecting conductor 120P and the interposer connecting conductor 150P may be soldered using solder alloys including Cu/Sn, Cu/Ni/Sn, Cu/Ni/SnBi, etc. In certain embodiments, a bump may be further included between the chip connecting conductor 120P and the interposer connecting conductor 150P (as shown in FIG. 4B).

In addition, the semiconductor chips 120 arranged side by side may be connected to each other through the wiring structure 150W in the interposer 150. As described above, because the wiring structure 150W has the line width less than or equal to 1 μm, the wiring structure 150W is able to transmit high frequency signals between the semiconductor chips 120. In addition, depending on the signal or current to be transmitted, the high frequency signals requiring a faster transmission speed may be transmitted through the second chip connecting conductor 120P2, the second interposer connecting conductor 150P2 and the wiring structure 150W. Other signals or ground may be transmitted through the first chip connecting conductor 120P1, the first interposer connecting conductor 150P1, the through via 153 and the redistribution circuit structure 110. That is to say, in the multi-chip package 100 of the disclosure, signals between the semiconductor chips 120 may be transmitted through different paths depending on signal properties.

The multi-chip package 100 according to the disclosure may include an underfill 170 between the semiconductor chips 120 and the interposer 150. The underfill 170 may fill a space between the semiconductor chips 120 and the interposer 150 and encapsulate the interposer connecting conductor 150P and the chip connecting conductor 120P. The underfill 170 has an inclined sidewall, and an upper width of the underfill 170 is smaller than a lower width of the underfill 170. In certain embodiments, a width of the underfill 170 is gradually changed, and the width of the underfill 170 gradually decreases from one end closer to the interposer 150 towards the other end closer to the semiconductor chip 120. The material of the underfill 170 is not particularly limited, and may be an insulating material such as epoxy resin. In other embodiments, the multi-chip package 100 according to the disclosure may also replace the underfill 170 with a passivation layer 175 between the semiconductor chip 120 and the interposer 150 (referring to FIG. 5B).

The multi-chip package 100 according to the disclosure may include an encapsulant 180 on the interposer 150 to encapsulate the semiconductor chips 120 and the interposer 150. The material of the encapsulant 180 may include a molding compound, a molding underfill, a resin or an epoxy molding compound (EMC) or the like. If necessary, the encapsulant 180 may be doped with an inorganic filler. A sidewall of the encapsulant 180, a sidewall of the interposer 150 and a sidewall of the redistribution circuit structure 110 are aligned to each other.

The redistribution circuit structure 110 is located on the second surface 150B of the interposer 150 and may be used to rewire output and input terminals of the semiconductor chips 120. For instance, the redistribution circuit structure 110 may be used to fan-out the input and output terminals of the semiconductor chips 120 to connect the semiconductor chips 120 and a printed circuit board (PCB) (not shown). The redistribution circuit structure 110 includes a plurality of redistribution dielectric layers 114 and a plurality of redistribution wiring layers 116 embedded in the redistribution dielectric layer 114 and connected to the through via 153. The material of the redistribution dielectric layer 114 may include polyimide, epoxy resin, acrylic resin, phenolic resin, bismaleimide-trazine resin (BT resin) or any other suitable polymer dielectric material and silicon oxide layer, silicon nitride layer, silicon oxynitride layer or other suitable silicon dielectric material. In certain embodiments, the material of the redistribution dielectric layer 114 may include photosensitive insulating resin. The material of the redistribution wiring layer 116 may include a conductive material such as copper (Cu), silver (Ag), palladium (Pd), aluminum (Al), nickel (Ni), titanium (Ti), gold (Au), platinum (Pt), tungsten (W) or alloys thereof.

The redistribution circuit structure 110 may further include a redistribution via 118, and the redistribution via 118 may be used to connect the redistribution wiring layers 116 located at different layers. The material of the redistribution via 118 may include a conductive material such as copper (Cu), silver (Ag), palladium (Pd), aluminum (Al), nickel (Ni), titanium (Ti), gold (Au), platinum (Pt), tungsten (W) or alloys thereof. An upper width W1 of the redistribution via 118 may be smaller than a lower width W2 of the redistribution via 118. That is to say, an included angle β between the inclined sidewall of the redistribution via 118 and a lower surface of the redistribution dielectric layer 114 may be greater than 90°.

Although the redistribution circuit structure 110 in FIG. 1 is illustrated as including three redistribution dielectric layers 114 and three redistribution wiring layers 116, the disclosure is not limited thereto. The multi-chip package 100 according to the disclosure may include more or fewer layer of the redistribution dielectric layer 114 and the redistribution wiring layer 116 than those shown in the drawings.

The multi-chip package 100 according to the disclosure may further include a conductive terminal 190. The conductive terminal 190 is partially embedded in the lowermost redistribution dielectric layer 114 to be connected to the lowermost redistribution wiring layer 116. The conductive terminal 190 may be used to connect the multi-chip package 100 with an external device such as a printed circuit board. The conductive terminal 190 may be, for example, a solder ball, but the disclosure is not limited thereto.

In the multi-chip package 100 according to the disclosure, the semiconductor chips 120 arranged side by side may be interconnected by the wiring structure 150W having the high density and the high number of layers to achieve high efficiency signal transmission. In addition, the multi-chip package 100 according to the disclosure also provides other electrical paths for transmitting high current, so as to improve the reliability of the multi-chip package 100 of the disclosure. At the same time, the multi-chip package 100 according to the disclosure could realize a fan-out type packaging by rewiring the semiconductor chips 120 through the redistribution circuit structure 110.

Figure 5A:
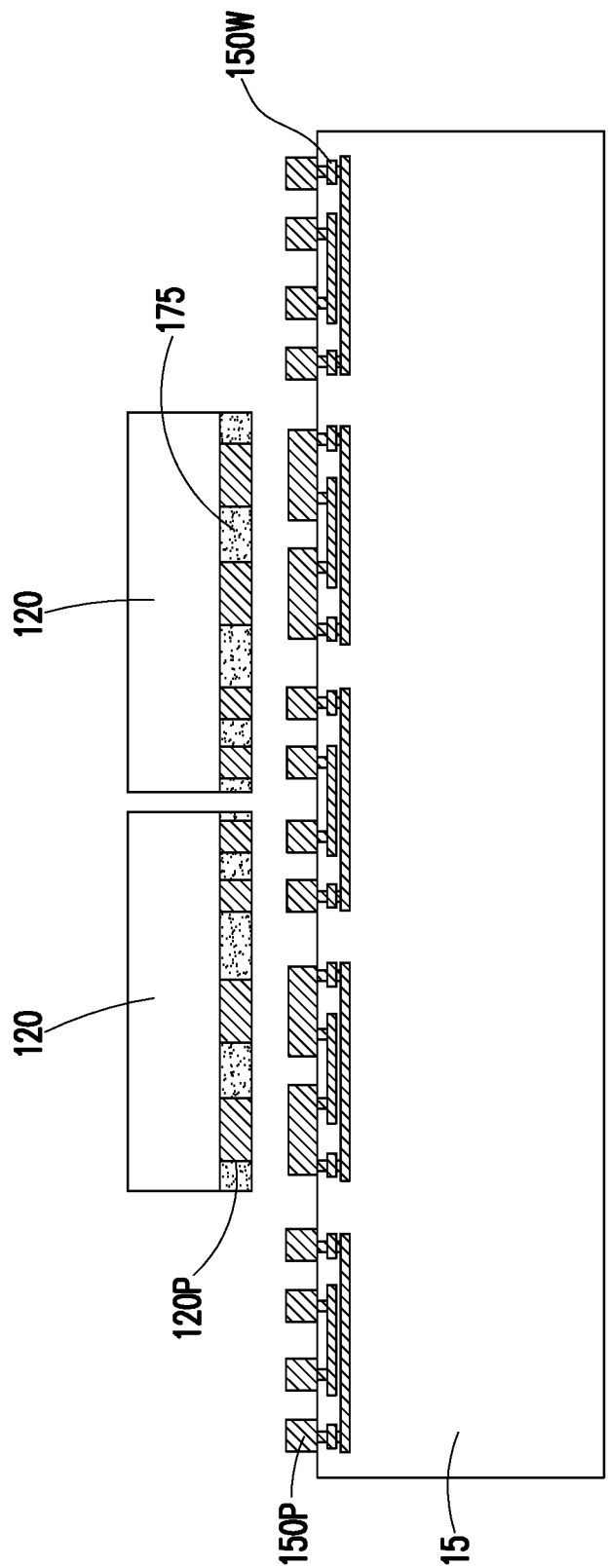
FIG. 5A and FIG. 5B are cross-sectional views illustrating a method of bonding chips according to another embodiment of the disclosure.
Figure 5B:
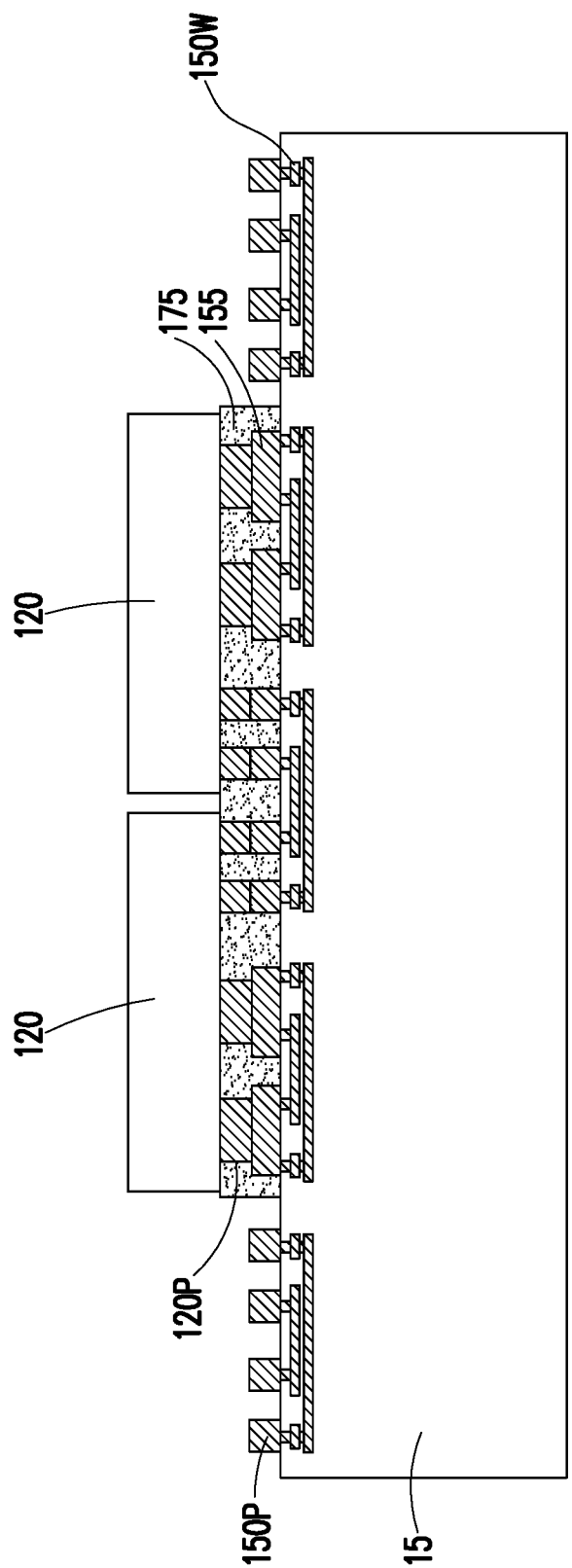

FIG. 3A to FIG. 3H are cross-sectional views of manufacturing process steps for manufacturing a multi-chip package according to an embodiment of the disclosure. FIG. 4A and FIG. 4B are cross-sectional views illustrating a method of bonding chips according to an embodiment of the disclosure. FIG. 5A and FIG. 5B are cross-sectional views illustrating a method of bonding chips according to another embodiment of the disclosure.

Figure 3A:
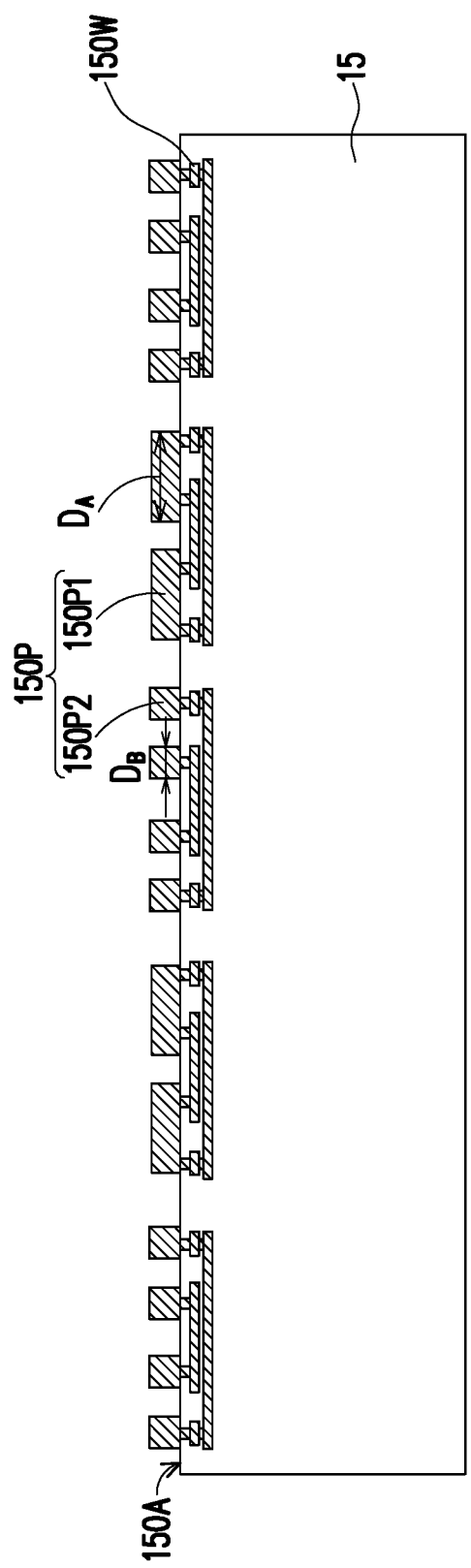
FIG. 3A to FIG. 3H are cross-sectional views of manufacturing process steps for manufacturing a multi-chip package according to an embodiment of the disclosure.

Referring to FIG. 3A, a semiconductor substrate 15 having the wiring structure 150W is provided. The semiconductor substrate 15 may be, for example, a silicon substrate. Although the drawing only shows the process of forming one multi-chip package using the semiconductor substrate 15, however, the semiconductor substrate 15 having a large size may be used to simultaneously form multiple multi-chip packages in certain embodiments. For instance, a silicon wafer or a panel level silicon substrate may be used as the semiconductor substrate 15. The semiconductor substrate 15 has the interposer connecting conductor 150P on the first surface 150A, and the interposer connecting conductor 150P is electrically connected to the wiring structure 150W. The interposer connecting conductor 150P includes the first interposer connecting conductor 150P1 and the second interposer connecting conductor 150P2 having different sizes. That is to say, the width $D_A$ of the first interposer connecting conductor 150P1 may be greater than the width $D_B$ of the second interposer connecting conductor 150P2.

Figure 3B:
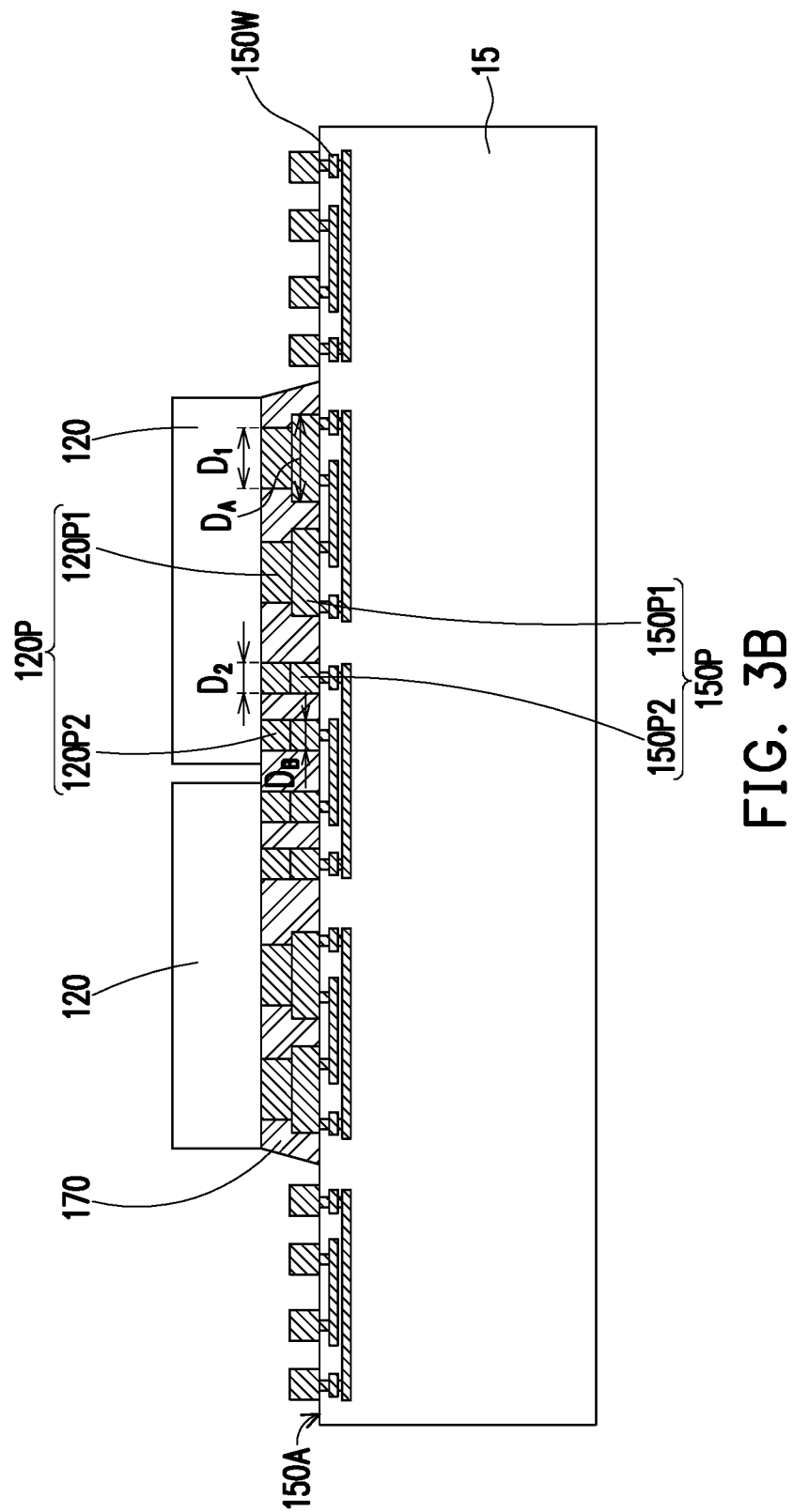

Referring to FIG. 3B, the semiconductor chips 120 are provided on the semiconductor substrate 15 so that the chip connecting conductor 120P and the interposer connecting conductor 150P are bonded to each other. The chip connecting conductor 120P includes the first chip connecting conductor 120P1 and the second chip connecting conductor 120P2 having different sizes. That is to say, the width $D_1$ of the first chip connecting conductor 120P1 may be greater than the width $D_2$ of the second chip connecting conductor 120P2. In certain embodiments, the first chip connecting conductor 120P1 and the first interposer connecting conductor 150P1 having the larger sizes are bonded to each other, and the second chip connecting conductor 120P2 and the second interposer connecting conductor 150P2 having the smaller sizes are bonded to each other. A bonding method of the chip connecting conductor 120P and the interposer connecting conductor 150P may be, for example, a direct bonding by heating and/or pressure. After the chip connecting conductor 120P and the interposer connecting conductor 150P are bonded, the underfill 170 may be applied on the semiconductor substrate 15 to encapsulate the chip connecting conductor 120P and the interposer connecting conductor 150P.

In certain embodiments, the chip connecting conductor 120P and the interposer connecting conductor 150P may be bonded to each other through bumps. Referring to FIG. 4A, a first bump 155 may be formed on the interposer connecting conductor 150P and a second bump 165 may be formed on the chip connecting conductor 120P. Then, the first bump 155 and the second bump 165 are bonded by using heat energy and/or pressure. The material of the first bump 155 and the second bump 165 may be, for example, a bonding metal including a solder alloy (e.g., Cu/Sn, Cu/Ni/Sn, Cu/Ni/SnBi), copper, gold, silver, indium, palladium, titanium, manganese, cobalt or alloys thereof (e.g., Ni/Au, Cu/Ni/Au, Cu/Ni/In). The materials of the first bump 155 and the second bump 165 may be different from each other. For instance, the material of the first bump 155 may be surface-treated pure copper, Ni/Au alloy, Cu/Ni/Au alloy or Cu/Ni/In alloy, etc., and the material of the second bump 165 may be Cu/Sn, Cu/Ni/Sn or Cu/Ni/SnBi alloy, etc. In certain embodiments, the materials of the first bump 155 and the second bump 165 do not contain solder components. In certain embodiments, the materials of the first bump 155 and the second bump 165 may be a low-temperature bonding metal with a melting point lower than 200° C. For instance, the low temperature bonding metal may include twin crystal copper, twin crystal silver or other nano twin crystal material, indium tin alloy, tin bismuth alloy, porous gold or a combination thereof. In comparison with the conventional solder ball or solder material that requires the reflow temperature to be more than or equal to 250° C., the low temperature bonding metal may stably bond the connecting structures at a relatively lower heating temperature (e.g., at the temperature below 200° C. or below 150° C.) while meeting the reliability requirements for electrical connection. In certain embodiments, it is possible that only one of the first bump 155 and the second bump 165 is formed. For instance, it is possible that only the first bump 155 is formed on the interposer connecting conductor 150P and the first bump 155 is bonded to the chip connecting conductor 120P.

Next, referring to FIG. 4B, after the first bump 155 and the second bump 165 are bonded, the underfill 170 may be applied on the semiconductor substrate 15 to encapsulate the chip connecting conductor 120P, the interposer connecting conductor 150P, the first bump 155 and the second bump 165. The underfill 170 may fill a space between the semiconductor chips 120 and the semiconductor substrate 15 and encapsulate the interposer connecting conductor 150P, the chip connecting conductor 120P, the first bump 155 and the second bump 165.

Referring to FIG. 5A and FIG. 5B, in certain embodiments, the passivation layer 175 may be formed on the semiconductor chips 120. The material of the passivation layer 175 may be an organic material such as resin, non-conductive adhesive film, dielectric material or the like. A surface of the chip connecting conductor 120P and a surface of the passivation layer 175 between the semiconductor chips 120 may be coplanar. When the chip connecting conductor 120P and the interposer connecting conductor 150P are bonded to each other, as being encapsulated by the passivation layer 175 and exposed only the surface for connection, the chip connecting conductor 120P may be prevented from being damaged by external force. In this way, yield rate may be improved.

Referring back to FIG. 3C, the encapsulant 180 is formed on the semiconductor substrate 15. A forming method of the encapsulant 180 includes the following steps. An encapsulating material layer covering the semiconductor substrate 15 and the semiconductor chips 120 is formed on the semiconductor substrate 15 by a suitable process (e.g., a molding process or a deposition process). Afterwards, a surface grinding and polishing process or a surface planarization process is performed to expose upper surfaces of the semiconductor chips 120.

Figure 3C:
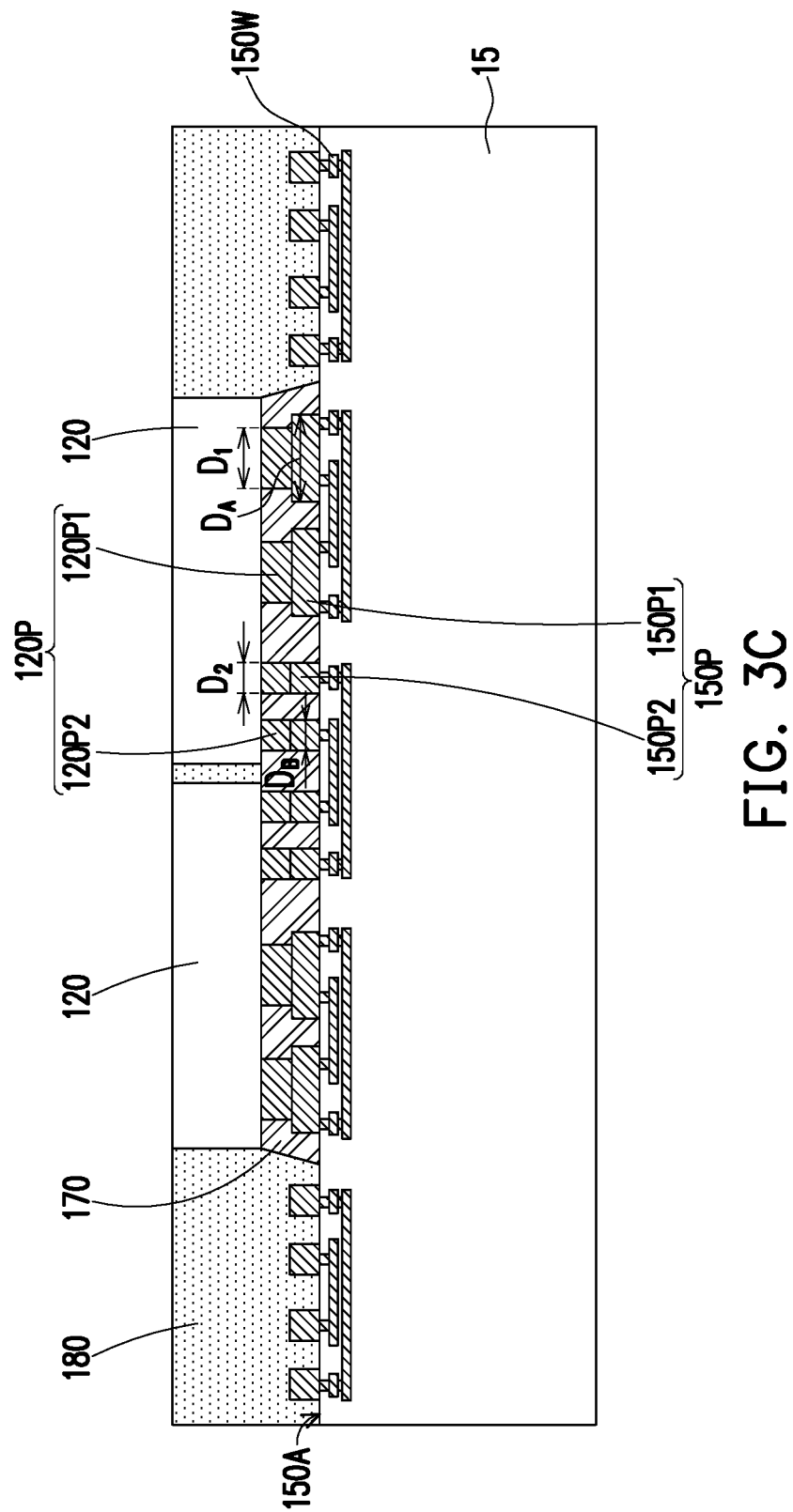
Figure 3D:
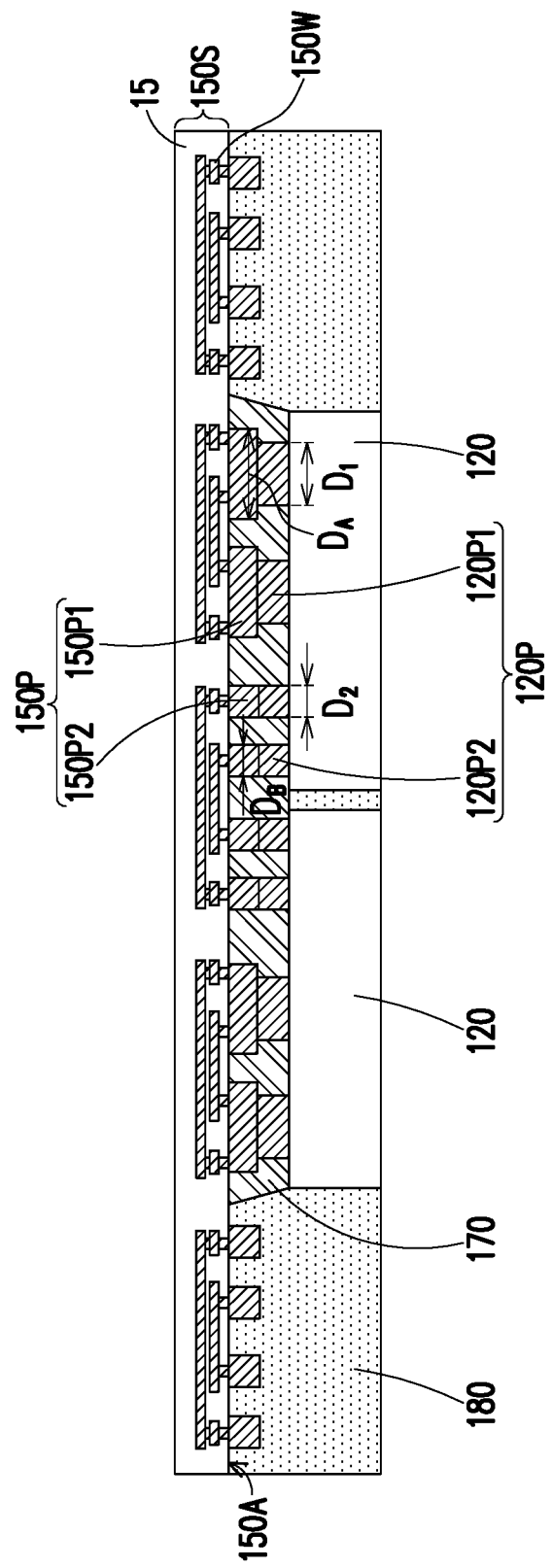

Next, referring to FIG. 3C and FIG. 3D, the structure obtained in FIG. 3C is turned upside down, and a thinning process such as a grinding process or an etching process is performed on a back surface of the semiconductor substrate 15 to reduce a thickness of the semiconductor substrate 15. The purpose of reducing the thickness of the semiconductor substrate 15 is to miniaturize and thin the final multi-chip package. In addition, the reduced thickness of the semiconductor substrate 15 also contributes to the subsequent formation of the dielectric body 150R. If necessary, this step may be omitted.

Figure 3E:
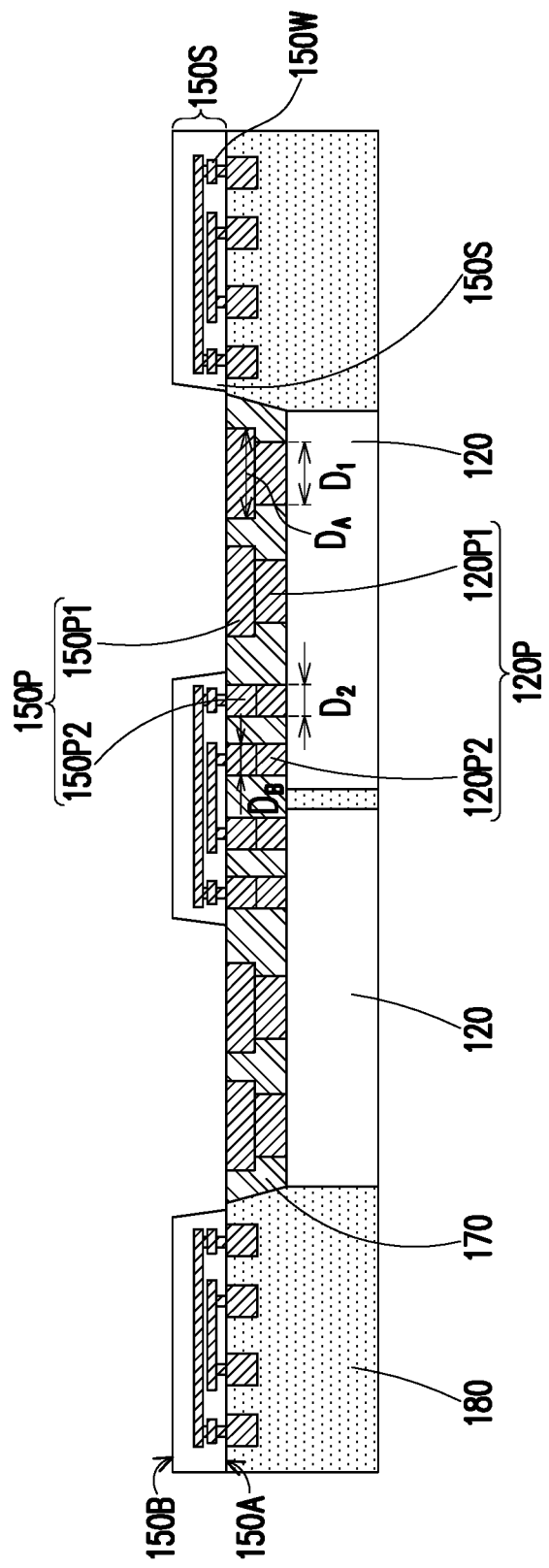

Referring to FIG. 3E, a portion of the semiconductor substrate 15 is removed by, for example, an etching process to form the semiconductor bodies 150S physically separated from each other and expose a portion of the interposer connecting conductor 150P, the underfill 170, and/or the encapsulant 180. At least one of the semiconductor bodies 150S simultaneously overlaps at least a portion of at least two of the semiconductor chips 120 in a direction perpendicular to the first surface 150A to be connected to the at least two of the semiconductor chips 120 at the same time. The rest of the semiconductor bodies 150S may not overlap the semiconductor chips 120 in the direction perpendicular to the first surface 150A. In certain embodiments, the rest of the semiconductor bodies 150S may partially overlap the semiconductor chips 120 in the direction perpendicular to the first surface 150A, but each of the semiconductor bodies 150S are physically spaced apart from the others.

Figure 3F:
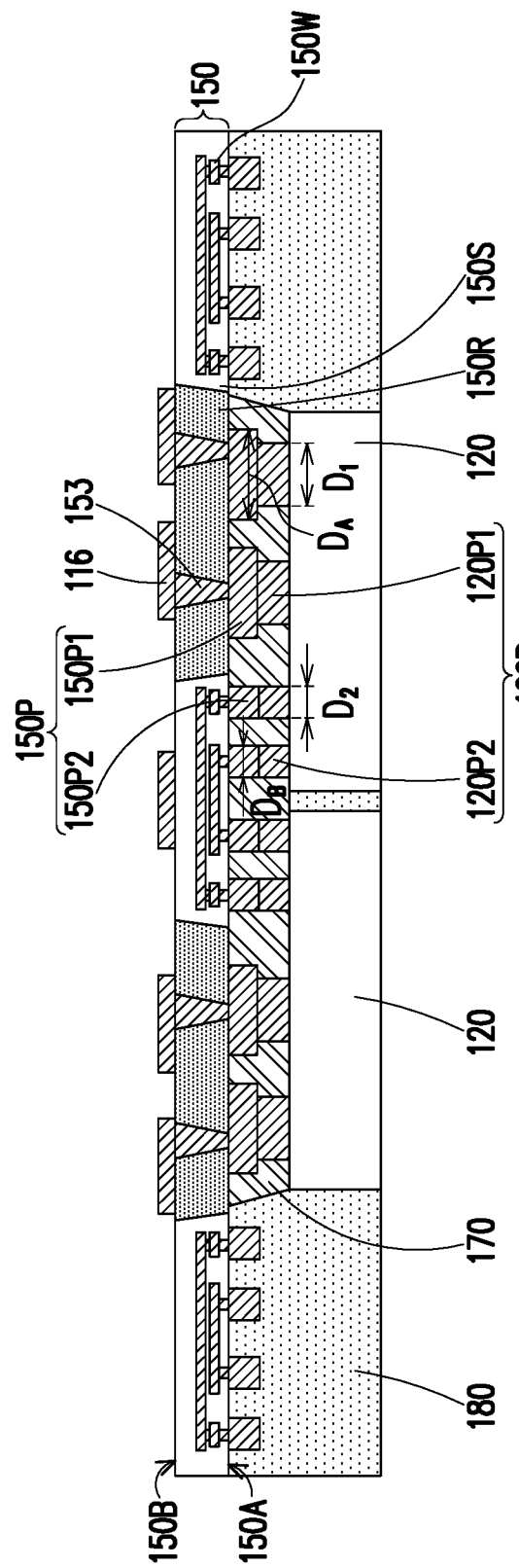

Referring to FIG. 3F, the dielectric body 150R may be formed between the semiconductor bodies 150S on the encapsulant 180 using any suitable method such as a spin coating. The dielectric body 150R may form the second surface 150B that exceeds the semiconductor bodies 150S. Then, a planarization process is used to remove a portion of the dielectric body 150R so that a surface of the dielectric body 150R and a surface of the semiconductor body 150S are substantially coplanar to thereby complete the preparation of the body of the interposer 150. Next, the through via 153 may be formed in the dielectric body 150R and the redistribution wiring layer 116 may be formed on the second surface 150B of the interposer 150. First, a through via hole penetrating through the second surface 150B and the first surface 150A of the interposer is formed in the dielectric body 150R to expose the interposer connecting conductor 150P. Here, a forming method of the through via hole in the dielectric body 150R may use different processes depending on the material of the dielectric body 150R. When the dielectric body 150R is a photosensitive insulating layer including photosensitive insulating resin, the dielectric body 150R may be patterned by a lithography process to form the through via hole. When the dielectric body 150R is a non-photosensitive insulating layer, the through via hole may be formed in the dielectric body 150R through a lithography/etching process, a laser drilling process or a mechanical drilling process. The redistribution wiring layer 116 and the through via 153 may be integrally formed. For instance, the process of forming the redistribution wiring layer 116 and the through via 153 includes the following steps. First, a seed layer is sputtered or deposited on the second surface 150B of the interposer 150 and the surface of the through via hole. Here, the material of the seed layer may be a conductive material such as titanium/copper. Next, a patterned photoresist layer is formed on the seed layer to expose the seed layer. A conductive material is formed on the seed layer exposed by the patterned photoresist layer through an electroplating process. The conductive material may include copper (Cu), silver (Ag), palladium (Pd), aluminum (Al), nickel (Ni), titanium (Ti), gold (Au), platinum (Pt), tungsten (W) or alloys thereof. Next, the photoresist layer and a portion of the seed layer not covered by the conductive material are removed to form the redistribution wiring layer 116 and the through via 153.

Figure 3G:
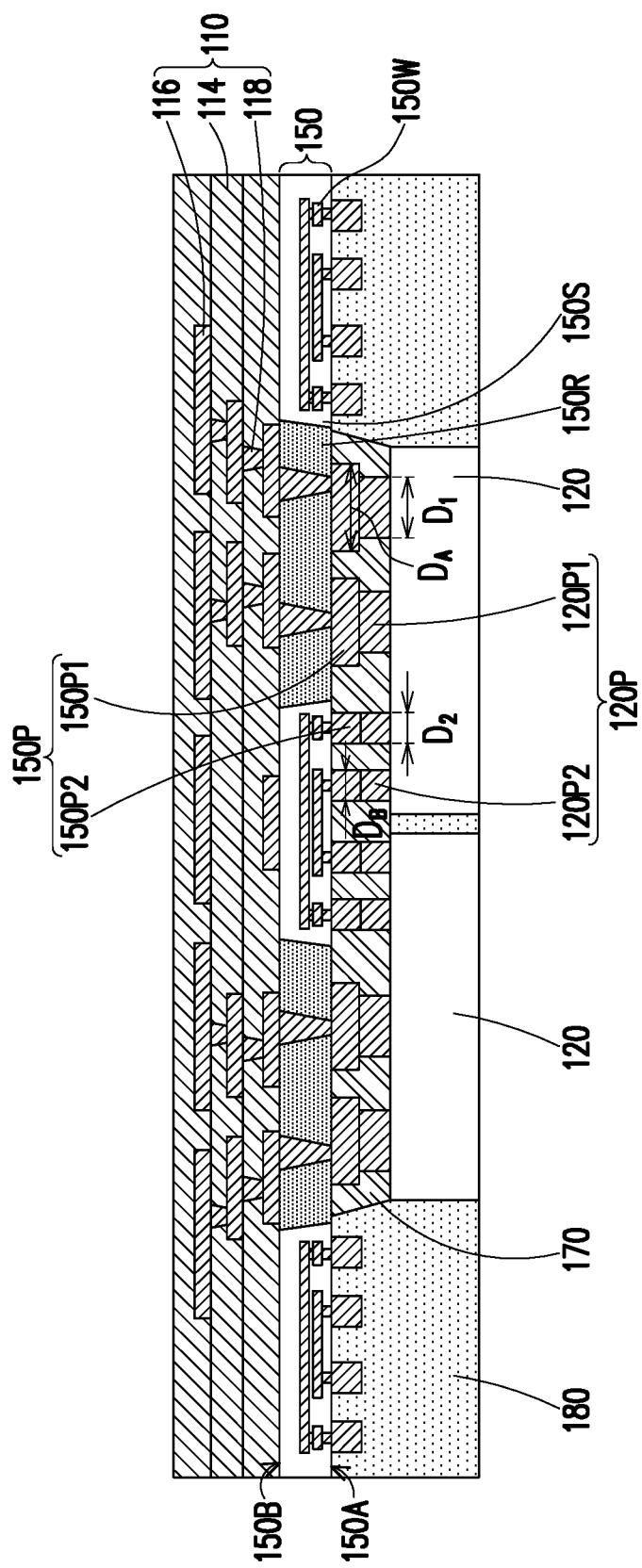

Referring to FIG. 3G, the redistribution dielectric layer 114 may be formed on the redistribution wiring layer 116 and the through via 153 in a similar manner to the formation of the dielectric body 150R, thereby forming the redistribution circuit structure 110.

The redistribution circuit structure 110 may include the redistribution wiring layer 116 of multi-layer or single-layer. When the redistribution circuit structure 110 includes the redistribution wiring layer 116 of multi-layer, the process of forming the redistribution wiring layer 116 of an upper layer includes the following steps. First, a via hole is formed in the redistribution dielectric layer 114 to expose the redistribution wiring layer 116 thereunder. Here, a forming method of the via hole in the redistribution dielectric layer 114 may use different processes depending on the material of the redistribution dielectric layer 114. When the redistribution dielectric layer 114 is a photosensitive insulating layer including photosensitive insulating resin, the redistribution dielectric layer 114 may be patterned by a lithography process to form the via hole. When the redistribution dielectric layer 114 is a non-photosensitive insulating layer, the redistribution dielectric layer 114 may be patterned by a lithography/etching process, a laser drilling process or a mechanical drilling process to form the via hole. Next, the redistribution wiring layer 116 of upper layer and the redistribution via 118 filling the via hole are formed in the same manner as the above-described method of forming the redistribution wiring layer 116 to be connected to the redistribution wiring layer 116 exposed by the via hole. Although the redistribution circuit structure 110 is illustrated as including three redistribution dielectric layers 114 and three redistribution wiring layers 116 in the drawings, the disclosure is not limited thereto. The redistribution circuit structure 110 may include more or fewer layers of the redistribution dielectric layer 114 and the redistribution wiring layer 116 than those shown in the drawings.

Figure 3H:
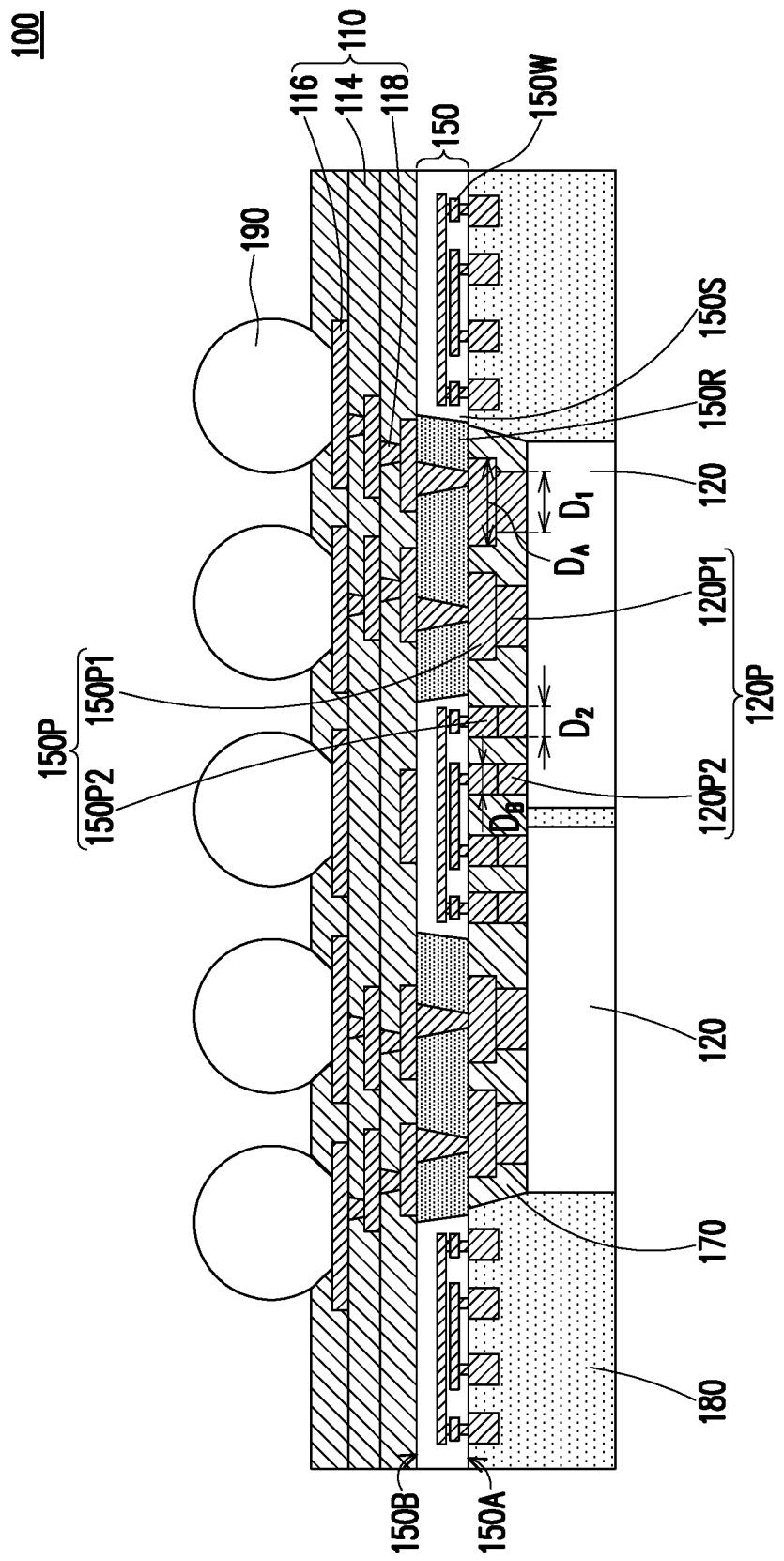

Referring to FIG. 3H, the conductive terminals 190 may be formed on the redistribution circuit structure 110 to complete the multi-chip package 100 of the disclosure shown in FIG. 1. The semiconductor substrate 15 having a large size may be used to simultaneously form multiple multi-chip packages 100 of the disclosure. Then, each of the multi-chip packages 100 is separated by processes such as cutting. Therefore, the sidewall of the interposer 150 in the multi-chip package and the sidewall of the encapsulant 180 in the multi-chip package 100 of the disclosure may be aligned with the sidewall of the redistribution circuit structure 110.

In summary, the disclosure provides a multi-chip package and a manufacturing method thereof. The multi-chip package of the disclosure could shorten the power and/or signal transmission paths in the multi-chip package and improve overall performance of the multi-chip package. At the same time, the multi-chip package of the disclosure also includes a redistribution structure to provide the design freedom for the fan-out package.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A multi-chip package, comprising:
an interposer including a dielectric body, a plurality of semiconductor bodies separated by the dielectric body, a through via penetrating through the dielectric body, and a wiring structure located in each of the plurality of semiconductor bodies;
a plurality of semiconductor chips located side by side on a first surface of the interposer and electrically connected to the wiring structure;
an encapsulant located on the first surface of the interposer and encapsulating at eas a portion of the plurality of semiconductor chips; and
a redistribution circuit structure located on a second surface of the interposer opposite to the first surface of the interposer and electrically connected to the plurality of semiconductor chips through the through via.

2. The multi-chip package of claim 1, wherein a line width of the wiring structure is less than 1 μm.

3. The multi-chip package of claim 1, wherein an interposer-interconnecting conductor is disposed on the first surface of the interposer, a chip-connecting conductor is disposed on a surface of each of the plurality of semiconductor chips closely adjacent to the interposer, and the interposer-interconnecting conductor and the chip-connecting conductor are bonded to each other.

4. The multi-chip package of claim 3, wherein a bonding surface between the interposer-interconnecting conductor and the chip: connecting conductor is a solderless bonding surface.

5. The multi-chip package of claim 3, wherein the interposer-interconnecting conductor and the chip-connecting conductor are bonded through a bonding metal with a melting point lower than 200° C.

6. The multi-chip package of claim 3, further comprising a first bump located between the interposer-interconnecting conductor and the chip-connecting conductor.

7. The multi-chip package of claim 6, further comprising a second bump located between the first bump and the chip: connecting conductor.

8. The multi-chip package of claim 3, further comprising:
a passivation layer disposed between the interposer and the plurality of semiconductor chips and encapsulating the interposer-interconnecting conductor and the chip-connecting conductor.

9. The multi-chip package of claim 3, wherein the interposer-interconnecting conductor comprises a first interposer-interconnecting conductor and a second interposer-interconnecting conductor, and a width of the first interposer-interconnecting conductor is greater than a width of the second interposer-interconnecting conductor.

10. The multi-chip package of claim 9, wherein the chip-connecting conductor comprises a first chip-connecting conductor and a second chip: connecting conductor, and a width of the first chip-connecting conductor is greater than a width of the second chip-connecting conductor.

11. The multi-chip package of claim 10, wherein the first interposer-interconnecting conductor and the first chip-connecting conductor are bonded to each other, and the second interposer-interconnecting conductor and the second chip-connecting conductor are bonded to each other.

12. The multi-chip package of claim 9, wherein the through via is connected to the first interposer-interconnecting conductor, and the wiring structure is connected to the second interposer-interconnecting conductor.

13. The multi-chip package of claim 1, wherein a width of the dielectric body increases as a distance from the plurality of semiconductor chips increases.

14. The multi-chip package of claim 1, wherein the redistribution circuit structure comprises a redistribution dielectric layer and a redistribution wiring layer, and a line width of the redistribution wiring layer is greater than a line width of the wiring structure.

15. The multi-chip package of claim 1, wherein a sidewall of the encapsulant, a sidewall of the interposer and a sidewall of the redistribution circuit structure are aligned to each other.

16. The multi-chip package of claim 1, further comprising:
an underfill disposed between the interposer and the plurality of semiconductor chips, wherein a width of the underfill increases as a distance from the plurality of semiconductor chips increases.

17. The multi-chip package of claim 1, wherein at least one semiconductor body among the plurality of semiconductor bodies overlaps at least two of the plurality of semiconductor chips in a direction perpendicular to the first surface.

18. A multi-chip package, comprising:
an interposer including a dielectric body, a semiconductor body, a through via penetrating through the dielectric body and a wiring structure located in the semiconductor body, the through via and the wiring structure being spaced apart from each other;
a plurality of semiconductor chips located side by side on a first surface of the interposer, each of the plurality of semiconductor chips being electrically connected to the wiring structure and the through via; and
a redistribution circuit structure located on a second surface of the interposer and electrically connected to the through via, the second surface of the interposer being opposite to the first surface of the interposer.

19. The multi-chip package of claim 18, wherein a line width of the wiring structure is less than 1 μm.

20. A manufacturing method of a multi-chip package, comprising:
providing a plurality of semiconductor chips on a first surface of a semiconductor substrate so that each of the plurality of semiconductor chips is electrically connected to a wiring structure in the semiconductor substrate;
forming an encapsulant on the first surface of the semiconductor substrate to encapsulate the plurality of semiconductor chips;
removing a portion of the semiconductor substrate from a second surface of the semiconductor substrate opposite to the first surface so that remaining portions of the semiconductor substrate are separated from each other;
forming a dielectric body in a space generated by the removing the portion of the semiconductor substrate;
forming, in the dielectric body, a through via penetrating through the dielectric body and connected to the plurality of semiconductor chips; and
forming a redistribution circuit structure on the remaining portions of the semiconductor substrate and the dielectric body, wherein the redistribution circuit structure is electrically connected to the through via.

* * * * *